United States Patent
Alvarez Valenzuela et al.

(10) Patent No.: US 12,081,114 B2
(45) Date of Patent: Sep. 3, 2024

(54) POWER CONVERTER AND METHOD FOR OPERATING THE POWER CONVERTER

(71) Applicant: Siemens Energy Global GmbH & Co. KG, Munich (DE)

(72) Inventors: Rodrigo Alonso Alvarez Valenzuela, Nuremberg (DE); Joerg Dorn, Buttenheim (DE); Herbert Gambach, Uttenreuth (DE); Yeqi Wang, Langensendelbach (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 204 days.

(21) Appl. No.: 17/703,023

(22) Filed: Mar. 24, 2022

(65) Prior Publication Data

US 2022/0311327 A1 Sep. 29, 2022

(30) Foreign Application Priority Data

Mar. 24, 2021 (EP) .................................... 21164446

(51) Int. Cl.
*H02M 1/32* (2007.01)
*G01K 3/10* (2006.01)
*H02M 1/10* (2006.01)

(52) U.S. Cl.
CPC ............... *H02M 1/32* (2013.01); *G01K 3/10* (2013.01); *H02M 1/10* (2013.01)

(58) Field of Classification Search
CPC .................................. H02M 1/10; H02M 1/32
See application file for complete search history.

(56) References Cited

U.S. PATENT DOCUMENTS

| 2023/0010737 A1* | 1/2023 | Geske | ................... | H02M 7/539 |
| 2023/0308006 A1* | 9/2023 | Suyakov | ............... | H02M 7/483 |

FOREIGN PATENT DOCUMENTS

| CN | 112464443 A | 3/2021 |
| WO | WO 2020125968 A1 | 6/2020 |

OTHER PUBLICATIONS

Y. Zhang, H. Wang, Z. Wang, Y. Yang and F. Blaabjerg, "Impact of lifetime model selections on the reliability prediction of IGBT modules in modular multilevel converters," 2017 IEEE Energy Conversion Congress and Exposition (ECCE), Cincinnati, OH, USA, 2017, pp. 4202-4207, doi: 10.1109/ECCE.2017.8096728.*

(Continued)

*Primary Examiner* — Jue Zhang
*Assistant Examiner* — Lakaisha Jackson
(74) *Attorney, Agent, or Firm* — Laurence A. Greenburg; Werner H. Stemer; Ralph E. Locher

(57) ABSTRACT

A method operates a power converter that contains power converter arms. Each of the power converter arms has switching modules and each of the switching modules has a plurality of semiconductor switches and an energy store. A temperature value for the power converter is ascertained on the basis of a state model of the power converter, wherein the ascertainment is repeated so as to obtain time-related temperature values. A number and a magnitude of temperature swings that have occurred are ascertained from the temperature values, and a remaining service life for the power converter is estimated based on the ascertained number and magnitude. A power converter is configured to carry out the above-described method.

9 Claims, 2 Drawing Sheets

(56) References Cited

OTHER PUBLICATIONS

Ma et al., "Loss and Thermal Model for Power Semiconductors Including Device Rating Information", The 2014 International Power Electronics Conference, Department of Energy Technology, Aalborg University, Aalborg 9220, Denmark; 2014.

Zhang, Yi et al: "Impact of lifetime model selections on the reliability prediction of IGBT modules in modular multilevel converters"; 2017 IEEE Energy Conversion Congress and Exposition, (ECCE); IEEE; pp. 4202-4207; XP033247373; DOI: 10.1109/ECCE.2017.8096728; 2017.

Velazco, Diego et al: "IGBT Lifetime Estimation in a Modular Multilevel Converter for bidirectional point-to-point HVDC application"; 2020 22nd European Conference on Power Electronics and Applications (EPE'20 ECCE Europe); EPE Association; pp. 1-10; XP033835453; DIO: 10.23919/EPE20ECCEEUROPE43536.2020.9215880; 2020.

Alavi et al., "Assessment of Thermal Network Models for Estimating IGBT Junction Temperature of a Buck Converter", 8th Power Electronics, Drive Systems & Technologies Conference (PEDST C 2017) Feb. 14-16, 2017, Ferdowsi University of Mashhad, Mashhad, Iran; 2017.

Zhang, Yi et al: "Simplified Estimation of the Junction Temperature Fluctuation at the Output Frequency for IGBT Modules in Modular Multilevel Converters"; 2018 IEEE Energy Conversion Congress and Exposition (ECCE); IEEE; pp. 6830-6837; XP033464223; ISBN: 978-1-4799-7312-5 DOI: 10.1109/ECCE.2018.8558180; 2018.

\* cited by examiner

POWER CONVERTER AND METHOD FOR OPERATING THE POWER CONVERTER

CROSS-REFERENCE TO RELATED APPLICATION

This application claims the priority, under 35 U.S.C. §119, of European Patent Application EP 21164446.3, filed Mar. 24, 2021; the prior application is herewith incorporated by reference in its entirety.

FIELD AND BACKGROUND OF THE INVENTION

The invention relates to a method for operating a power converter that has power converter arms. Each power converter arm has switching modules that each have a plurality of semiconductor switches and an energy store, in which at least one temperature value for the power converter is ascertained on the basis of a state model of the power converter. The ascertainment is repeated so as to obtain time-related temperature values. The power converter arms can be switchable, for example, between in each case a DC voltage side and an AC voltage side of the power converter (AC-DC converter), between in each case a first and a second AC voltage side of the power converter (AC-AC converter), between in each case a first and a second DC voltage side of the power converter (DC-DC converter), or else can be connectable to phase lines of an AC voltage grid. The switching modules arranged in the respective power converter arm are suitably arranged in an electrical series circuit.

A method relevant to the art is disclosed in international patent application WO 2020/125968 A1. According to the known method, the temperature value is obtained by means of suitable modeling of the state model.

In order to maintain reliability of the power converter, the power converter has to undergo maintenance at certain intervals of time. In particular, the maintenance has to be performed before the end of the remaining service life of the power converter. During a maintenance operation, hardware components, in particular semiconductors or semiconductor switches, and passive components, such as inductors and capacitors, are usually checked for possible failures and replaced if necessary. The intervals between the maintenance operations (maintenance intervals) are in this case firmly predefined without taking into account critical or uncritical operations or operating states of the power converter during the last maintenance interval.

In addition to planning according to fixed maintenance intervals, there is also the possibility of measuring the temperature of the semiconductors (in particular a junction temperature) and of the passive components. The maintenance intervals can then be varied accordingly, taking the measured temperatures into account. It is however only possible to measure the internal junction temperature with considerable outlay (in particular outlay in terms of cost). A lack of accuracy in the measurement often means that in particular the temperatures during dynamic processes cannot be adequately detected and transmitted. Accordingly, the maintenance intervals cannot be established reliably.

SUMMARY OF THE INVENTION

The object of the invention is to propose a method that is relevant to the art and further improves the reliability of the power converter.

In the case of the method mentioned at the outset, the object is achieved, according to the invention, by virtue of the fact that a number and a magnitude of temperature swings that have occurred are ascertained from the temperature values, and a remaining service life for the power converter is estimated based on the ascertained number and magnitude.

For efficient configuration of the maintenance cycle and to extend the maintenance intervals, it is advantageous to predict in advance the remaining service life of the semiconductor switches, the passive components and therefore also the entire power converter. In this case, the number of (thermally) dynamic processes or thermal cycles have a large influence on the expected remaining service life. The dynamic processes can be examined or assessed on the basis of the temperature swings that have occurred within a considered period of time. For this purpose, the temperature values are time-related, that is to say that a corresponding time is assigned to each of the temperature values. A temperature swing corresponds to a difference between a maximum and a minimum temperature value within a predefined time interval, for example a grid period (in this case based on a rated frequency of a connected AC voltage grid). The knowledge of thermal cycles of the semiconductors and the passive components allows conclusions to be drawn about the state of health of the converter. A current-dependent and voltage-dependent thermal model or state model therefore allows a prediction or an estimation of the expected remaining service life and therefore also of the necessary maintenance intervals. All the important data are provided to the prediction methods, taking into account dynamic processes, specifically in the event of faults. Better lifetime analyses are possible and the end-of-life time can be approximately determined as a result. The estimation advantageously makes it possible to arrange the maintenance according to absolutely essential maintenance appointments instead of fixed maintenance intervals, as a result of which the maintenance outlay can be significantly reduced, since the maintenance is then only carried out if it is really necessary. As a direct consequence, this results in relatively long usability and availability of the converter (high disponibility). In the simplest case, an "averaged" temperature value for the entire power converter is determined repeatedly over time and results from the information about some, preferably all, relevant components of the power converter. An estimation of the remaining service life of the power converter can be ascertained from the temperature value related to the power converter. By way of example, the estimation is based on a determination of the number and magnitude of the temperature swings, wherein the number of temperature swings that have a predetermined minimum magnitude is compared with data predefined by the manufacturer of the semiconductor switches. These data can comprise a total number of temperature swings of the predetermined minimum magnitude that a semiconductor switch can experience during operation until failure. If the number of temperature swings, which is determined by means of the temperature values, is compared with the total number, conclusions about the remaining service life can be drawn therefrom (in particular from the difference between the total number and the number of temperature swings already experienced according to the temperature values). According to one example, a rated temperature for a semiconductor switch could be predefined as 110° C. The predefined (for example by the manufacturer of the semiconductor switch) number of temperature swings of 20 K that the semiconductor switch can experience up until failure thereof is denoted by n. If the number nh of temperature swings of the magnitude 20 K is now counted from the temperature values, it is possible, for example, to hold off on a maintenance operation until this number nh reaches the value n-m, wherein m is a safety margin.

In particular, statistical methods can also be used to estimate the remaining service life. A probability distribution can then be ascertained as a result of the estimation, wherein a corresponding event probability is associated with each value of the remaining service life in the sense of a statistical event. This procedure allows statistical evaluation of the estimation results. The probabilities can be compared with events that have occurred in reality (for example an actual failure of a component) over a relatively long period of time (using an adaptation, based thereon, of the state model and/or the estimation itself), with the result that an even more accurate prediction or estimation of the remaining service life is made possible.

The temperature values are preferably ascertained at intervals of time of less than 1 second, particularly preferably at intervals of time of less than 100 microseconds. This makes it possible to calculate the temperature swings in a particularly finely resolved and therefore reliable manner. This is advantageous as dynamic and transient processes can sometimes occur at double/quadruple the grid frequency, as a result of which a sampling time of at least 5 ms or 2.5 ms is necessary (in accordance with the Shannon theorem). In particular, the magnitude of the temperature swing can be determined by adding differences between two successive temperature values over a predefined period of time. By way of example, the predefined period of time can be half of, a whole, or a multiple of a grid period.

In particular, the magnitude of the temperature swing can generally be ascertained from a difference between two temperature values, for example a minimum and a maximum temperature value within a predefined time interval (or between closest minimum and maximum temperature values). Furthermore, it is also conceivable, as mentioned above, for two successive temperature values to be used. In such a case, a plurality of differences can be added to ascertain the temperature swing.

Preferably, the state model takes at least the following power converter variables into account when calculating the temperature values: energy store voltages, switching states and switching frequencies of at least some switching modules and arm voltages and arm currents of the power converter arm or arms in question. The state model can be implemented in a regulation device of the power converter, in particular in a current regulation system (current control system). The state model preferably contains a temperature model that is used to calculate (in particular estimate) the present temperature or the corresponding present temperature value. In this case, the temperature value of the power converter can be a temperature value of an "average switching module". This means that a switching module that in the simplest case represents all switching modules of the power converter, suitably all switching modules of a power converter arm, is modeled in the temperature model. The temperature (temperature value) of a switching module is expediently in turn understood to be an average (or alternatively a highest) temperature of the semiconductor or junctions thereof (junction temperature). In the best case scenario, all of the junction temperatures of the average switching module (i.e. the two IGBT and the two diode junction temperatures for a half-bridge) are calculated and can correspondingly be used in the further processing. Methods for temperature or state modeling of semiconductors are known from the specialist literature. Examples that can be mentioned here are the article by Beczkowski et al. "Complete Loss and Thermal Model of Power Semiconductors Including Device Rating Information", IEEE Transactions on Power Electronics, 2015, and the article by Alavi et al. "Assessment of thermal network models for estimating IGBT junction temperature of a buck converter", 2017 8th Power Electronics, Drive Systems & Technologies Conference (PEDSTC). The energy store voltage is the voltage instantaneously present at one of the energy stores of one of the switching modules. The energy store voltage can be detected by means of a suitable measuring apparatus at or in the switching module and transmitted to the regulation device. The switching state of a switching module indicates whether the energy store of the switching module is presently in the current path of the power converter arm or is bypassed ("on" or "off"). It is advantageous to take the switching state into account in the state model or temperature model because the switching state indicates where in the power converter the temperature is rising or losses are arising at that moment in time. The switching frequency is suitably defined as the switching pair frequency (number of switch-on operations+switch-off operations/time interval; time interval is, for example, equal to the grid period). It is advantageous to take the switching frequencies into account in the state model or temperature model because the switching frequency influences the magnitude of the switching losses. The arm voltage is the voltage instantaneously present at a power converter arm. The arm voltages are measured continuously for all power converter arms by means of voltage measuring apparatuses and can be transmitted to the regulation device. The arm current is the current presently flowing through the associated power converter arm. The arm current also determines, amongst other things, the current flow direction and therefore, in the most favorable case, also which semiconductor is current-conducting (IGBT/diode). The arm currents of the power converter arms are likewise measured continuously by means of current measuring devices and can be transmitted to the regulation device. By way of example, a redundancy consumption value is conceivable as a further input parameter for the state model. The redundancy consumption value indicates the number of switching modules in a power converter arm that have already failed in the past or are faulty, as a result of which, as is known, the available/healthy switching modules are loaded to a greater extent.

Preferably, the remaining service life is estimated taking a service life model of the semiconductor switch into account. As already explained above, a simple model can include a predefined number of temperature swings. Furthermore, other, more detailed service life models are also however possible. By way of example, the service life models can include further semiconductor parameters, environmental influences or consideration of different magnitudes of the temperature swings. More precise service life models allow an improved prediction, but are usually relatively complex.

If the estimated remaining service life falls below a predefined threshold, a signal for a maintenance instruction is preferably output. By way of example, the signal can have a simple display function, but it can also, for example, contain the expected service life and further information about the power converter state. The signal is preferably transmitted to the operator of the power converter.

According to one embodiment of the invention, the temperature values are transmitted to an external data processing device via a data network that is external to the power converter. The remaining service life is estimated by means of the external data processing device. In principle, the lifetime analyses can be carried out both in the power converter regulation system, the superordinate regulator or controller, and externally. By way of example, the external data processing device can be located in what is known as the "cloud". This dispenses with possible restrictions with respect to the memory and computation capacity that result from the potentially limited resources of the power converter regulation system that is internal to the converter. The data processed in the cloud can then also be made available to the user or operator.

According to a further embodiment of the invention, the temperature values are collated with temperature values of further power converters in order to expand the data basis. The data obtained therefore also allow collation with evaluations and knowledge of other converter (stations), as a result of which the statistical values and models can be continually verified and improved.

The invention also relates to a power converter that comprises power converter arms, wherein each power converter arm has switching modules that each have a plurality of semiconductor switches and an energy store.

The object of the invention is to propose a power converter of this type that is as efficient and reliable as possible during operation.

In the case of a power converter relevant to the art, the object is achieved according to the invention by virtue of at least one data processing device being provided that is designed to carry out a method according to the invention.

The advantages of the power converter according to the invention emerge in particular from the advantages described in connection with the method according to the invention.

The power converter can be provided, for example, for an HVDC transmission application or else for a FACTS application, and in particular can be a modular multilevel converter. The switching modules can, for example, be the half-bridge switching modules or full-bridge switching modules known to a person skilled in the art.

Other features which are considered as characteristic for the invention are set forth in the appended claims.

Although the invention is illustrated and described herein as embodied in a power converter and a method for operating the power converter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
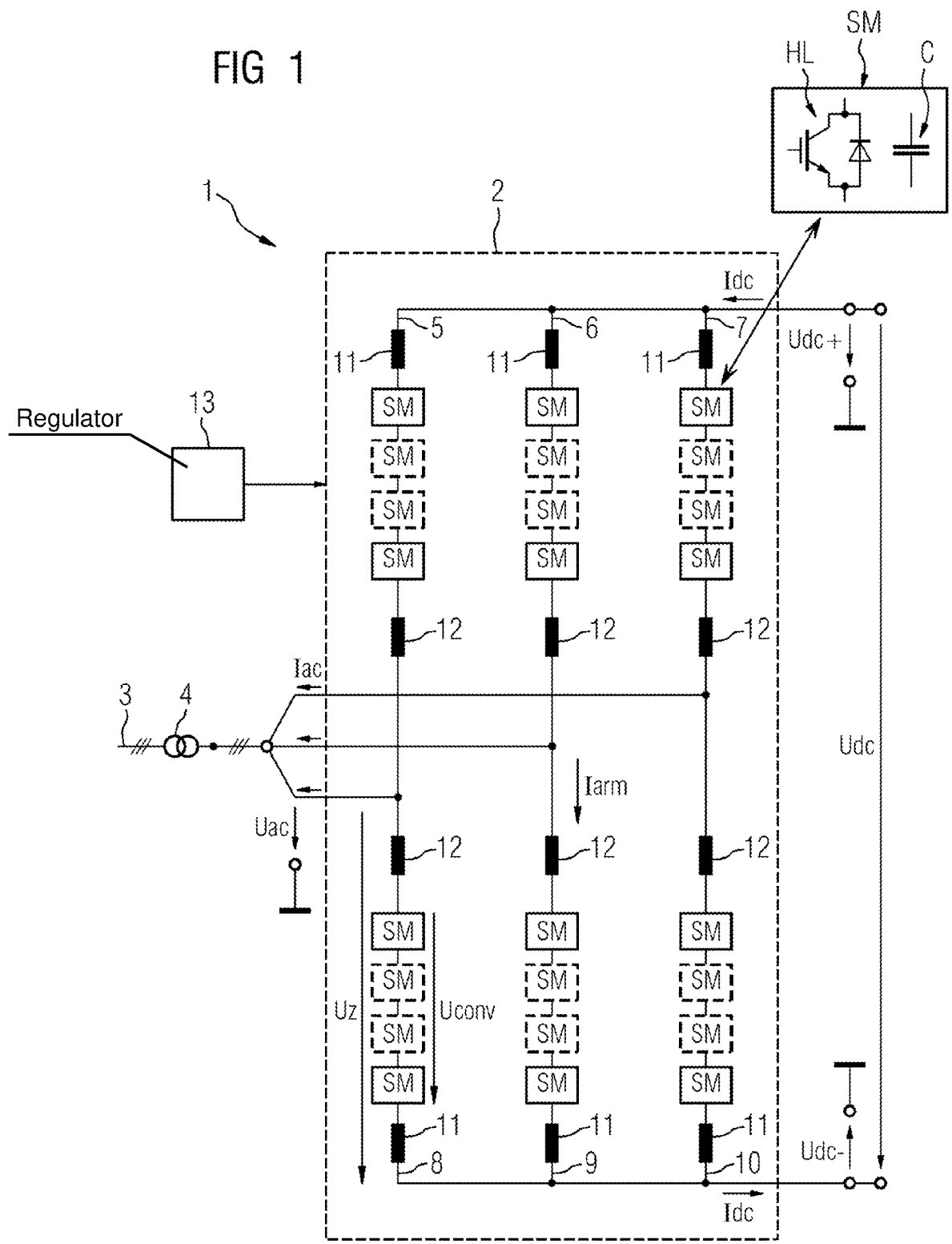
FIG. 1 is a block diagram showing a power converter according to the invention.

Referring now to the figures of the drawings in detail and first, particularly to FIG. 1 thereof, there is shown a power converter arrangement 1. The power converter arrangement 1 contains a power converter 2 that is a modular multilevel converter (MMC). In the example illustrated, the MMC is designed to convert an AC voltage of an AC voltage grid 3, to which the MMC 2 is connected by means of a grid transformer 4, into a DC voltage Ude.

The MMC 2 contains six power converter arms 5-10 that are connected to one another in a double star connection. Each of the identically constructed power converter arms 5-10 contains two arm inductors 11, 12 and in each case a series circuit of switching modules SM. In the exemplary embodiment illustrated in FIG. 1, all of the switching modules SM are of identical construction, which in general is not necessary, however. The number of switching modules SM in each power converter branch 5-10 is also fundamentally arbitrary and can be adapted to the respective application. The switching modules SM can be, for example, full-bridge switching modules or half-bridge switching modules. Each switching module SM contains controllable semiconductor switches, for example IGBTs, IGCTs, or the like (a full-bridge switching module comprises at least four semiconductor switches, a half-bridge switching module comprises at least two semiconductor switches), suitably free-wheeling diodes associated with the semiconductor switches and an energy store (for example in the form of a capacitor) and a control assembly that can be used to actuate the semiconductor switches. With respect to the design of the mentioned examples of switching modules, reference is hereby made to the above-mentioned international patent application WO 2020/125968 A1.

The power converter 2 also contains a central regulation device 13 that is designed to regulate the MMC 2 (or the regulation variables) and to actuate the switching modules SM. The regulation device 13 receives, from a superordinate entity, stipulations regarding the required active power and reactive power, and possibly also voltage and/or current, that are converted by the regulation unit into setpoint values of regulation parameters, for example of voltage and current. The regulation parameters can therefore in particular be an AC-voltage-side voltage Uac, an AC-voltage-side current Ilac, a DC-voltage-side current Idc and/or a DC-voltage-side voltage Udc. In a power converter that is designed as a symmetrical monopole, a voltage Udc+ between the positive DC voltage pole and the ground potential and a voltage Udc− between the negative DC voltage pole and the ground potential can be significant. In the example illustrated here, the arm current (the current flowing through one of the power converter arms) is in each case the controlled variable and the arm voltage is correspondingly the manipulated variable of the power converter arrangement 1.

Figure 2:
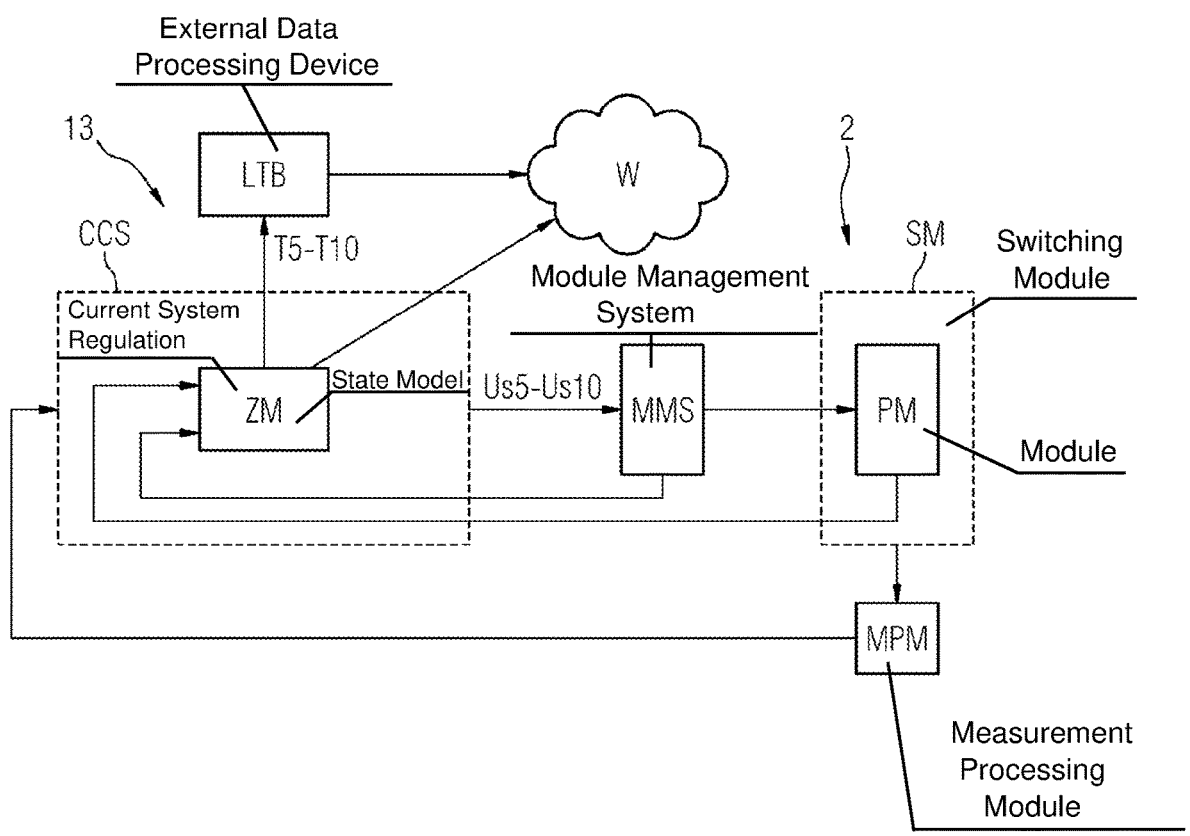
FIG. 2 is a block diagram showing an exemplary embodiment of a regulation device for a power converter according to the invention.

FIG. 2 shows the regulation device 13 for the power converter 2 (for example the power converter 2 of FIG. 1). The regulation device 13 contain a plurality of components. A module management system MMS is assigned to each of the switching modules SM of the power converter 2. The MMS is designed to determine or to receive, by transmission, state data of the switching module SM from the assigned switching module SM and to transmit these to a central current regulation system (current control system) CCS. Measured variables such as a current flowing in the corresponding power converter arm are detected and processed by means of a measurement & processing module MPM.

Independently of the implementation of the remaining components, the measured variables measured at the switching module SM can be processed, in particular filtered (for example subjected to low-pass filtering) or denoised (by filtering out high-frequency signal components) before being passed on or transmitted to the CCS.

The current regulation system CCS contains a state model module ZM that does not have to be realized as a separate hardware module, but can also be implemented as a software function within the regulation hardware. A state model of the power converter 2 is implemented or stored in the state model module ZM. By way of example, the state model can be realized in the form of one or more differential equations, which can convert calculated input variables into the same output variables. In the example illustrated here, at least the following input variables enter the state model: energy store voltages of all of the switching modules SM of the power converter 2 (these are provided by the MMS), switching states of all of the switching modules SM (these are transmitted by the switching modules) and switching frequencies of all of the switching modules SM (these are determined in the respective MMS and transmitted to the CCS) and arm voltages Uconv and arm currents Iarm of the power converter arms 5-10 (transmitted/measured by the MPM). (Scalar) time-related temperature values T5-T10 are provided as output variables for each of the power converter arms 5-10 at the output of the ZM. The temperature values are provided at intervals of time that correspond to the clocking of the current regulation system, e.g. at intervals of 50 microseconds. On the basis of the temperature values T5-T10 and further power converter variables, adaptations to the manipulated voltages Us5-Us10 can be determined or calculated and transmitted to the respective MMS by means of a regulation module (not visible in FIG. 2). The respective MMS then converts the manipulated voltages into suitable switching commands for the assigned switching modules SM and correspondingly transmits these switching commands to the individual switching modules SM.

The temperature values T5-T10 are also transmitted to a data processing device that is external to the power converter and comprises a module LTB that is designed to estimate the service life for the power converter 2.

At the same time, the concept also offers the possibility of being able to represent the temperature values in real time at any time and also of being able to make these available to a customer by means of what is known as the cloud W. Collation with temperature values of other power converter arrangements is likewise possible, as a result of which the real-time data obtained can be used to improve operating modes and algorithms. The knowledge of the present semiconductor losses or junction temperatures also allows optimization on the station level, such as, for example, by adaptation of the cooling circuit, adaptation of the setpoint values, etc.

The module LTB comprises data stored therein, for example from manufacturers of the semiconductor switches HL installed in the power converter 2, that comprise information about parameters and behavior of the semiconductors in the event of temperature changes. The calculation of the remaining service life can, for example, be based on a formula for the service life consumption of a semiconductor, Nf=a*(DeltaT)^b, wherein Nf is a number of load cycles, DeltaT is a predefined temperature swing, and a and b are semiconductor parameters specified by the manufacturer. Information about the remaining service life is provided at the output of the module LTB. This information is transmitted to the operator of the power converter 2, or made available within the cloud W. At the same time, a maintenance instruction can be generated and also made available to the operator if the estimation of the remaining service life shows a remaining service life that is below a predetermined threshold.

The invention claimed is:

1. A method for operating a power converter having power converter arms, wherein each of the power converter arms having switching modules each with a plurality of semiconductor switches and an energy store, which comprises the steps of:
    ascertaining a temperature value for the power converter on a basis of a state model of the power converter, wherein the ascertaining step is repeated so as to obtain time-related temperature values;
    ascertaining a number and a magnitude of temperature rises that have occurred from the time-related temperature values;
    estimating a remaining service life for the power converter based on the number and the magnitude of the temperature rises ascertained; and
    assigning an event probability to the remaining service life.

2. The method according to claim 1, which further comprises repeating the ascertaining of the temperature value at intervals of time of less than 1 second.

3. The method according to claim 1, which further comprises ascertaining the magnitude of a temperature rise from a difference between two temperature values.

4. The method according to claim 1, wherein the state model takes at least following power converter variables into account when calculating the temperature value: energy store voltages, switching states and switching frequencies of at least some of the switching modules and an arm voltage and an arm current of a power converter arm.

5. The method according to claim 1, which further comprises estimating the remaining service life by taking a service life model of a semiconductor switch into account.

6. The method according to claim 1, which further comprises outputting a signal for a maintenance instruction if the remaining service life falls below a predefined threshold.

7. The method according to claim 1, which further comprises transmitting the time-related temperature values to an external data processing device via a data network that is external to the power converter, and the remaining service life is estimated by means of the external data processing device.

8. The method according to claim 1, which further comprises collating the time-related temperature values with temperature values of further power converters in order to expand a data basis.

9. A power converter, comprising:
    power converter arms each having switching modules, each of said switching modules having a plurality of semiconductor switches and an energy store; and
    at least one data processing device configured to:
        ascertain a temperature value for the power converter on a basis of a state model of the power converter, wherein the ascertaining step is repeated so as to obtain time-related temperature values;
        ascertain a number and a magnitude of temperature rises that have occurred from the time-related temperature values;
        estimate a remaining service life for the power converter based on the number and the magnitude of the temperature rises ascertained; and assign an event probability to the remaining service life.

\* \* \* \* \*